United States Patent
Cordero et al.

(10) Patent No.: US 9,305,618 B2
(45) Date of Patent: *Apr. 5, 2016

(54) IMPLEMENTING SIMULTANEOUS READ AND WRITE OPERATIONS UTILIZING DUAL PORT DRAM

(71) Applicant: International Business Machines Corporation, Armonk, NY (US)

(72) Inventors: Edgar R. Cordero, Round Rock, TX (US); Carlos A. Fernandez, Hialeah, FL (US); Joab D. Henderson, Pflugerville, TX (US); Jeffrey A. Sabrowski, Leander, TX (US); Anuwat Saetow, Austin, TX (US); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 102 days.

This patent is subject to a terminal disclaimer.

(21) Appl. No.: 14/168,102

(22) Filed: Jan. 30, 2014

(65) Prior Publication Data

US 2015/0213853 A1 Jul. 30, 2015

(51) Int. Cl.
| | |
|---|---|
| *G06F 12/00* | (2006.01) |
| *G11C 7/10* | (2006.01) |
| *G11C 8/16* | (2006.01) |
| *G06F 11/10* | (2006.01) |
| *G11C 29/04* | (2006.01) |

(52) U.S. Cl.
CPC .......... *G11C 7/1075* (2013.01); *G06F 11/1048* (2013.01); *G11C 7/1045* (2013.01); *G11C 8/16* (2013.01); *G11C 2029/0411* (2013.01); *G11C 2207/2209* (2013.01)

(58) Field of Classification Search
CPC ............... G11C 7/1075; G11C 7/1045; G11C 2207/2209; G11C 8/16; G11C 2029/0411; G06F 11/1048
See application file for complete search history.

(56) References Cited

U.S. PATENT DOCUMENTS

| | | | |
|---|---|---|---|
| 5,559,450 A | 9/1996 | Ngai et al. | |
| 6,167,551 A * | 12/2000 | Nguyen et al. | ................ 714/770 |
| 6,191,998 B1 | 2/2001 | Reddy et al. | |
| 7,038,952 B1 | 5/2006 | Zack et al. | |
| 7,058,764 B2 | 6/2006 | Bearden | |
| 7,181,563 B2 | 2/2007 | Andreev et al. | |

(Continued)

OTHER PUBLICATIONS

Rejusha, M. et al., "Implementation of VLSI-Oriented FELICS Algorithm Using Pseudo Dual-Port RAM," Proceedings of the International Conference on Pattern Recognition, Informatics and Medical Engineering, Mar. 21-23, 2012, IEEE, pp. 68-73, 2012.

*Primary Examiner* — Kalpit Parikh
(74) *Attorney, Agent, or Firm* — Joan Pennington

(57) ABSTRACT

A method, system and memory controller are provided for implementing simultaneous read and write operations in a memory subsystem utilizing a dual port Dynamic Random Access Memory (DRAM) configuration. A DRAM includes a first partition and a second partition. A memory controller determines if memory requirements are above or below a usage threshold. If the memory requirements are below the usage threshold, the memory is partitioned into a read buffer and a write buffer, with writes going to the write buffer and reads coming from the read buffer, data being transferred from the write buffer to the read buffer through an Error Correction Code (ECC) engine. If the memory requirements are above the usage threshold, the entire memory is used for reads and writes.

10 Claims, 4 Drawing Sheets

(56) References Cited

U.S. PATENT DOCUMENTS

| | | |
|---|---|---|
| 8,402,348 B1 | 3/2013 | Gunnam et al. |
| 2002/0053011 A1* | 5/2002 | Aiken et al. .................. 711/170 |
| 2002/0162069 A1* | 10/2002 | Laurent ........................ 714/763 |
| 2010/0318749 A1 | 12/2010 | Matthews |

* cited by examiner

IMPLEMENTING SIMULTANEOUS READ AND WRITE OPERATIONS UTILIZING DUAL PORT DRAM

FIELD OF THE INVENTION

The present invention relates generally to the data processing field, and more particularly, relates to a method, system and memory controller for implementing simultaneous read and write operations in a memory subsystem utilizing a dual port Dynamic Random Access Memory (DRAM) configuration.

DESCRIPTION OF THE RELATED ART

Today's workloads can be very dynamic and as such memory subsystems should be designed with a certain degree of adaptability.

A need exists for an effective mechanism to enable enhanced memory subsystem adaptability and enhanced performance under certain conditions.

SUMMARY OF THE INVENTION

Principal aspects of the present invention are to provide a method, system and memory controller for implementing simultaneous read and write operations in a memory subsystem utilizing a dual port Dynamic Random Access Memory (DRAM) configuration. Other important aspects of the present invention are to provide such method, system and memory controller and DRAM configuration which can, under certain conditions, double the number of accesses, substantially without negative effects and that overcome some of the disadvantages of prior art arrangements.

In brief, a method, system and memory controller are provided for implementing simultaneous read and write operations in a memory subsystem utilizing a dual port Dynamic Random Access Memory (DRAM) configuration. A DRAM includes a first partition and a second partition. A memory controller determines if memory requirements are above or below a usage threshold. If the memory requirements are below the usage threshold, the memory is partitioned into a read buffer and a write buffer, with writes going to the write buffer and reads coming from the read buffer, data being transferred from the write buffer to the read buffer through an Error Correction Code (ECC) engine. If the memory requirements are above the usage threshold, the entire memory is used for reads and writes.

In accordance with features of the invention, the memory controller sends the DRAM at least one mode register set (MRS) command to setup the dual port DRAM configuration with the memory partitioned into a read buffer and a write buffer.

In accordance with features of the invention, the write buffer receives data including ECC from the bus, this data is held until an internal ECC, Reliability, Availability, and Serviceability (RAS), control logic of the DRAM is able to validate and transfer the data to the read buffer. Once data is transferred into the read buffer, it will be available for read operations, effectively allowing the system to perform reads and writes simultaneously.

In accordance with features of the invention, if the memory requirements are above the usage threshold, the memory controller will temporarily stop data flow and commands into that DRAM. This is the first step in the transition from the dual port configuration to a single port configuration. The memory controller must guarantee that sufficient time elapses so that the internal ECC, RAS, control logic of the DRAM is able to transfer all incoming data into the read buffer. This will ensure that all the data in the read buffer is exactly the same as the data in the write buffer. Finally, an MRS command is sent to disable dual port configuration.

In accordance with features of the invention, once the buffers are mirror copies of each other the memory controller can re-assign the lowest order address bits to the first location of the read buffer. This will ensure that the data is valid and ready for use prior to releasing the DRAM for single port operation. The final step will require an MRS command that will clear all the data on the write buffer, returning the DRAM to its normal capacity.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and memory controller are provided for implementing simultaneous read and write operations in a memory subsystem utilizing a dual port Dynamic Random Access Memory (DRAM) configuration.

Figure 1:
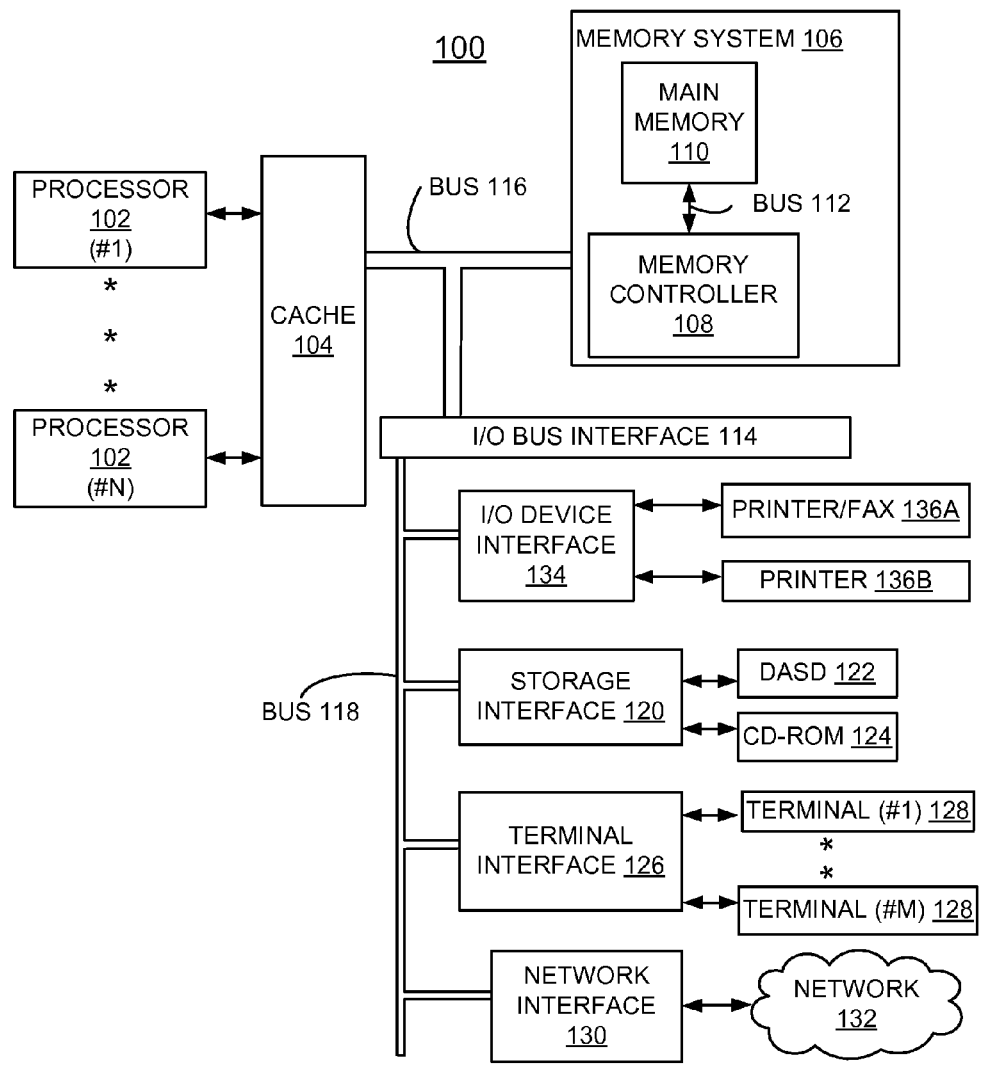
FIG. 1 illustrates an example computer system for implementing simultaneous read and write operations in a memory subsystem utilizing a dual port Dynamic Random Access Memory (DRAM) configuration in accordance with preferred embodiments.

Having reference now to the drawings, in FIG. 1, there is shown an example computer system generally designated by the reference character 100 for implementing simultaneous read and write operations in a memory subsystem utilizing a dual port Dynamic Random Access Memory (DRAM) configuration in accordance with the preferred embodiment. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a memory system 106 including a memory controller 108 and a main memory 110 connected by a bus 112. Bus 112 is one or more busses that send address/command information to main memory 110 and send and receive data from the memory 110. Main memory 110 is a random-access semiconductor memory for storing data, including programs. Main memory 110 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, memory controller 108 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

Computer system 100 is shown in simplified form sufficient for understanding the present invention. The illustrated computer system 100 is not intended to imply architectural or functional limitations. Although main memory 110 of main memory system 106 is represented conceptually in FIG. 1 as a single entity, it will be understood that in fact the main memory is more complex. In particular, main memory system 106 comprises multiple modules and components. The present invention can be used with various hardware implementations and systems and various other internal hardware devices.

Figure 2:
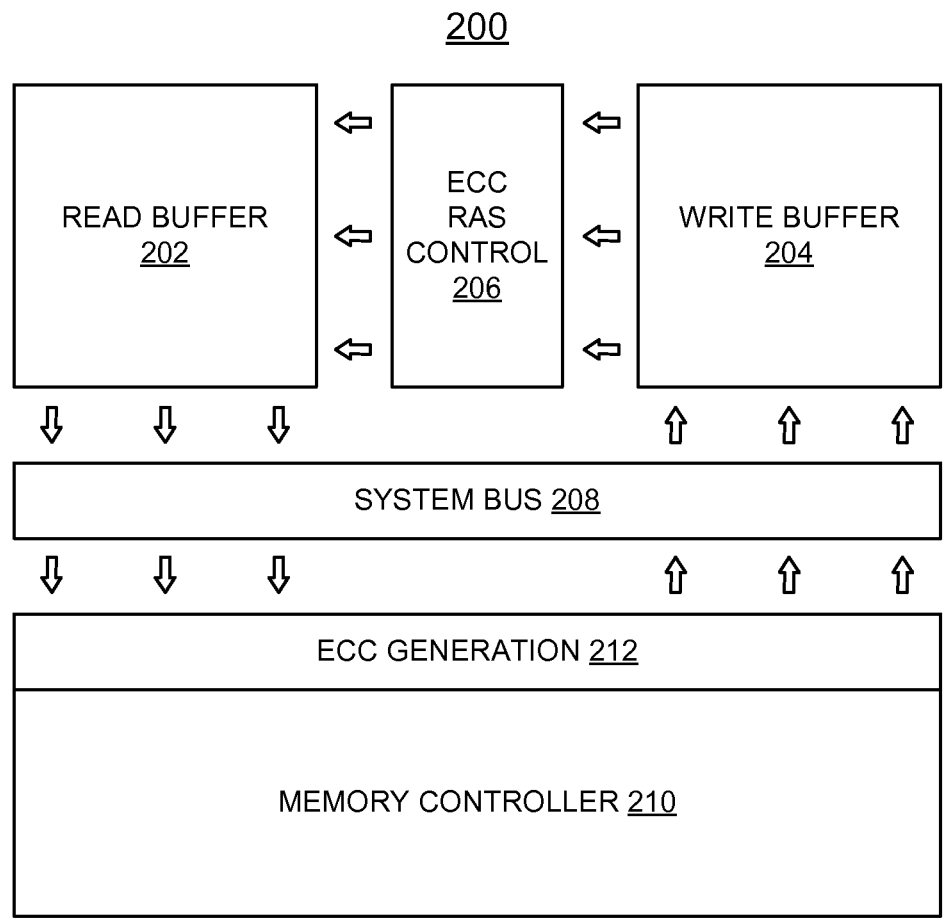
FIG. 2 illustrates exemplary functions of the memory subsystem of FIG. 1 for implementing simultaneous read and write operations in accordance with preferred embodiments.

An example memory subsystem, for example, of the main memory system 106 is illustrated and described with respect to FIG. 2 for implementing simultaneous read and write operations in a memory subsystem utilizing a dual port Dynamic Random Access Memory (DRAM) configuration.

Referring to FIG. 2, there is shown a high level block diagram illustrating example memory subsystem generally designated by the reference character 200 in the memory system 106 in accordance with the preferred embodiments.

In accordance with features of the invention, the memory subsystem 200 with the Dynamic Random Access Memory (DRAM) separated into two equal buffers, a read buffer 202 and a write buffer 204 in the dual port Dynamic Random Access Memory (DRAM) configuration. The write buffer 204 receives incoming data from a system bus 208, while the read buffer 202 provides ECC verified data back to the bus 208. An internal ECC, Reliability, Availability, and Serviceability (RAS), control logic 206 of the DRAM is able to validate and transfer the data to the read buffer 202. The memory subsystem 200 includes a memory controller 210 and an Error Correction Code (ECC) generation function 212 or ECC engine.

In accordance with features of the invention, the memory subsystem 200 includes the ECC, RAS, control logic 206 for use in the dual port DRAM configuration. The memory subsystem 200 performs scrub to the write memory buffer 204 only during dual port configuration, with an entry invalidated and marked unusable if an error occurs during the scrubbing process. Data is ECC checked as it is transferred from the write buffer 204 to the read buffer 202.

In accordance with features of the invention, the read and write operations are performed simultaneously, greatly increasing the performance of the memory subsystem 200 in the dual port DRAM configuration. For example, the memory performance can be increased by a factor of two while the memory subsystem 200 in the dual port DRAM configuration. The memory controller 212 determines if current workload demands additional resources beyond a specified threshold the memory space would then be configured in a single port configuration on the fly to maximize capacity rather than performance.

Figure 3:
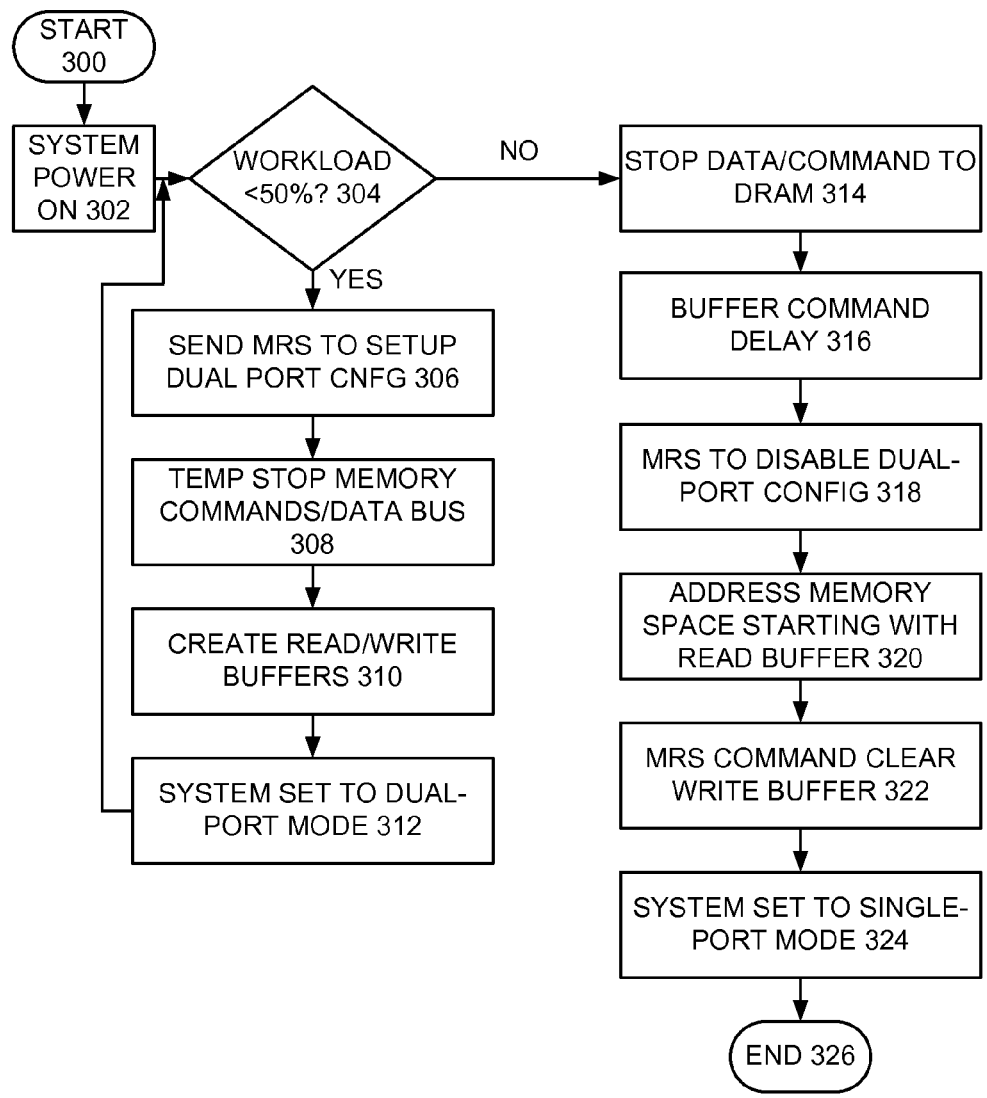
FIG. 3 is a flow chart illustrating exemplary operations for implementing simultaneous read and write operations in the memory subsystem of FIG. 1 in accordance with preferred embodiments.

Referring to FIG. 3, there are shown exemplary operations for implementing simultaneous read and write operations in the memory subsystem 200 utilizing a dual port Dynamic Random Access Memory (DRAM) configuration in accordance with one preferred embodiment starting at a block 300. As indicated in a block 302, system power on begins. As indicated in a decision block 304, the memory controller 210 determines if memory requirements are above or below a usage threshold, for example, if the workload is less than 50% of memory space. If the memory requirements are below the usage threshold, the memory controller sends the DRAM at least one mode register set (MRS) command to setup the dual port DRAM configuration with the memory partitioned into a read buffer and a write buffer as indicated in a block 306. As indicated in a block 308, the memory controller 210 temporarily stops data flow and commands into the DRAM data bus. The memory subsystem is partitioned to create a read buffer and a write buffer as indicated in a block 310. The memory subsystem is set to the dual-port mode with writes going to the write buffer and reads coming from the read buffer, data being transferred from the write buffer to the read buffer through an Error Correction Code (ECC) RAS control logic as indicated in a block 312. Then monitoring the workload continues at decision block 304.

If the memory requirements are above the usage threshold, the entire memory is used for reads and writes with the DRAM configured in a single port DRAM configuration. As indicated in a block 314, the memory controller 210 temporarily stops data flow and commands into the DRAM responsive to the memory requirements being above the usage threshold. As indicated in a block 316, the memory controller must guarantee that sufficient time elapses providing a buffer command delay so that the internal ECC, RAS, control logic of the DRAM is able to transfer all incoming data into the read buffer. The memory controller sends the DRAM at least one mode register set (MRS) command to disable the dual port DRAM configuration as indicated in a block 318. As indicated in a block 320, once the buffers are minor copies of each other the memory controller can re-assign the lowest order address bits to the first location of the read buffer. This will ensure that the data is valid and ready for use prior to releasing the DRAM for single port operation. The final step will require an MRS command that will clear all the data on the write buffer as indicated in a block 322, and the memory subsystem is set to the single port mode returning the DRAM to its normal capacity as indicated in a block 324. Operations end as indicated in block 326.

Figure 4:
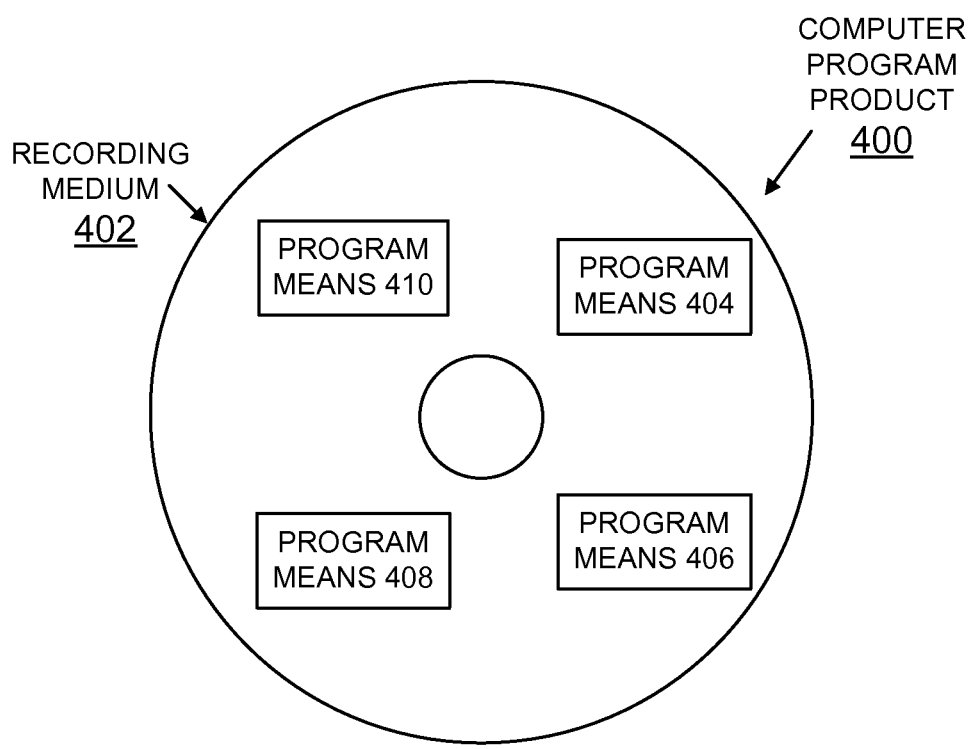
FIG. 4 is a block diagram illustrating a computer program product in accordance with the preferred embodiment.

Referring now to FIG. 4, an article of manufacture or a computer program product 400 of the invention is illustrated. The computer program product 400 is tangibly embodied on a non-transitory computer readable storage medium that includes a recording medium 402, such as, a floppy disk, a high capacity read only memory in the form of an optically read compact disk or CD-ROM, a tape, or another similar computer program product. Recording medium 402 stores program means 404, 406, 408, and 410 on the medium 402 for carrying out the methods for implementing simultaneous read and write operations in a memory subsystem 200 utilizing a dual port Dynamic Random Access Memory (DRAM) configuration of FIG. 2.

A sequence of program instructions or a logical assembly of one or more interrelated modules defined by the recorded program means 404, 406, 408, and 410, direct the memory subsystem 200 for implementing simultaneous read and write operations in a memory subsystem 200 utilizing the dual port Dynamic Random Access Memory (DRAM) configuration of the preferred embodiments.

While the present invention has been described with reference to the details of the embodiments of the invention shown in the drawing, these details are not intended to limit the scope of the invention as claimed in the appended claims.

What is claimed is:

1. A memory system for implementing simultaneous read and write operations in a memory subsystem utilizing a dual port Dynamic Random Access Memory (DRAM) configuration comprising:
   a DRAM includes a first partition and a second partition;
   a memory controller, said memory controller determining if memory requirements are above or below a usage threshold;
   said memory controller responsive to the memory requirements being below the usage threshold, partitioning the DRAM into a read buffer and a write buffer, with writes going to the write buffer and reads coming from the read buffer, data being transferred from the write buffer to the read buffer through an Error Correction Code (ECC) engine;
   said memory controller responsive to the memory requirements being above the usage threshold, using the entire DRAM for reads and writes; and
   said memory controller responsive to the memory requirements being above the usage threshold, temporarily stop data flow and commands into the DRAM to transition from the dual port configuration to a single port configuration.

2. The memory system as recited in claim 1, includes control code stored on a computer readable medium, and wherein said memory controller uses said control code to implement simultaneous read and write operation.

3. The memory system as recited in claim 1 includes said memory controller initially sending at least one mode register set (MRS) command to setup the dual port DRAM configuration with the DRAM partitioned into the read buffer and the write buffer.

4. The system as recited in claim 3 includes said memory controller transferring data to the write buffer including ECC from the bus, the data being held until an internal ECC, Reliability, Availability, and Serviceability (RAS), control logic of the DRAM is able to validate and transfer the data to the read buffer.

5. The system as recited in claim 4 includes said memory controller effectively allowing the system to perform reads and writes simultaneously responsive to the data being transferred into the read buffer.

6. A memory system for implementing simultaneous read and write operations in a memory subsystem utilizing a dual port Dynamic Random Access Memory (DRAM) configuration comprising:
   a DRAM includes a first partition and a second partition;
   a memory controller, said memory controller determining if memory requirements are above or below a usage threshold;
   said memory controller responsive to the memory requirements being below the usage threshold, partitioning the DRAM into a read buffer and a write buffer, with writes going to the write buffer and reads coming from the read buffer, data being transferred from the write buffer to the read buffer through an Error Correction Code (ECC) engine; and
   said memory controller responsive to the memory requirements being above the usage threshold, using the entire DRAM for reads and writes;
   said memory controller responsive to the memory requirements being above the usage threshold, temporarily stop data flow and commands into the DRAM to transition from the dual port configuration to a single port configuration; and
   said memory controller sending at least one mode register set (MRS) command to disable the dual port DRAM configuration.

7. The system as recited in claim 6 includes said memory controller providing a buffer command delay.

8. The system as recited in claim 6 includes said memory controller providing data in the read buffer as mirror copy of data in the write buffer.

9. The system as recited in claim 8 includes said memory controller providing data in the read buffer as mirror copy of data in the write buffer.

10. The system as recited in claim 9 includes said memory controller providing the DRAM set to a single port configuration mode.

* * * * *